United States Patent [19]

MacLennan

[11] 4,172,983
[45] Oct. 30, 1979

[54] CHARGE TRANSFER FILTER

[75] Inventor: Donald J. MacLennan, Ballston Lake, N.Y.

[73] Assignee: General Electric Company, Schenectady, N.Y.

[21] Appl. No.: 879,899

[22] Filed: Feb. 21, 1978

[51] Int. Cl.² .................. G11C 19/28; H01L 29/78; H01L 29/34
[52] U.S. Cl. .................. 307/221 D; 357/24; 357/54
[58] Field of Search ............ 357/24; 307/221 D

[56] References Cited

U.S. PATENT DOCUMENTS

| 4,124,861 | 11/1978 | Baertsch et al. | 357/24 |
| 4,124,862 | 11/1978 | Engeler et al. | 357/24 |

Primary Examiner—William D. Larkins
Assistant Examiner—Gene M. Munson
Attorney, Agent, or Firm—Julius J. Zaskalicky; Joseph T. Cohen; Marvin Snyder

[57] ABSTRACT

A charge transfer filter utilizing charge transfer accumulator structures for exponential smoothing of analog signals is described. The charge transfer accumulator structures provide short equilibration times, long smoothing time constants, high data rates and low dark currents.

8 Claims, 8 Drawing Figures

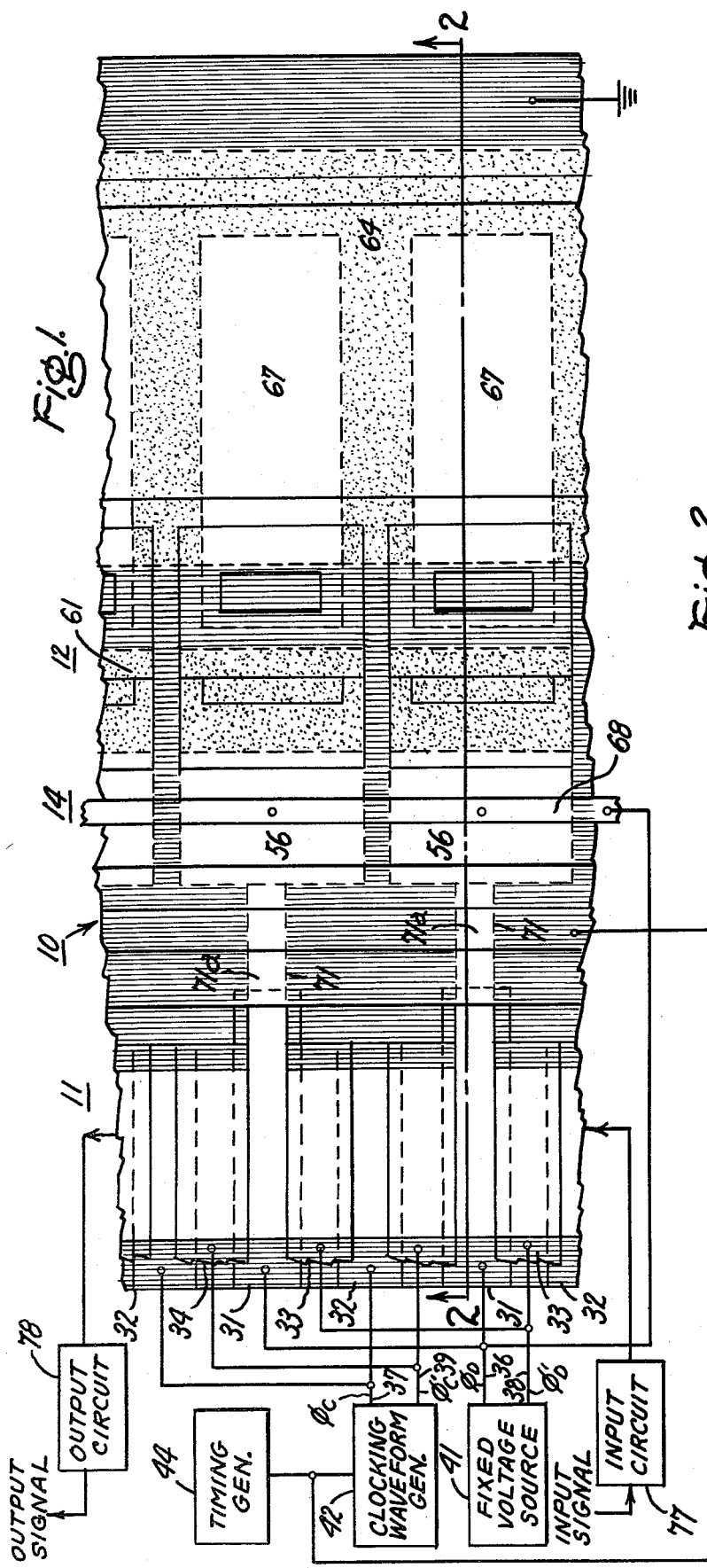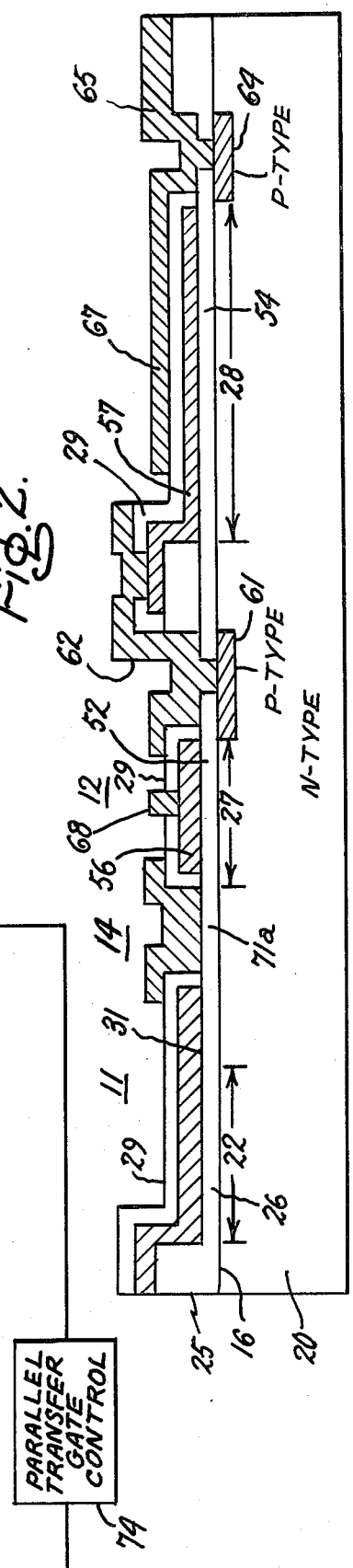

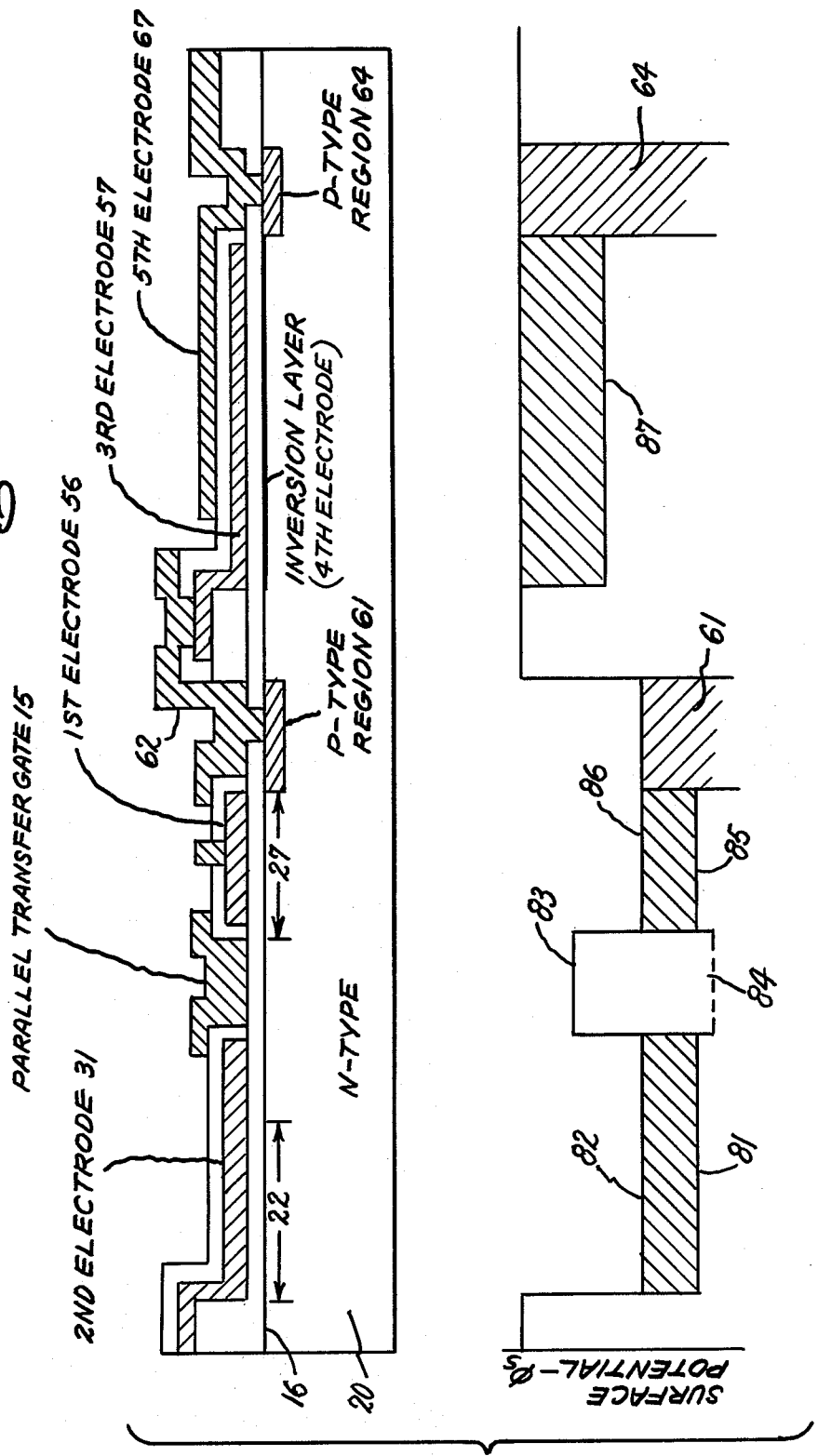

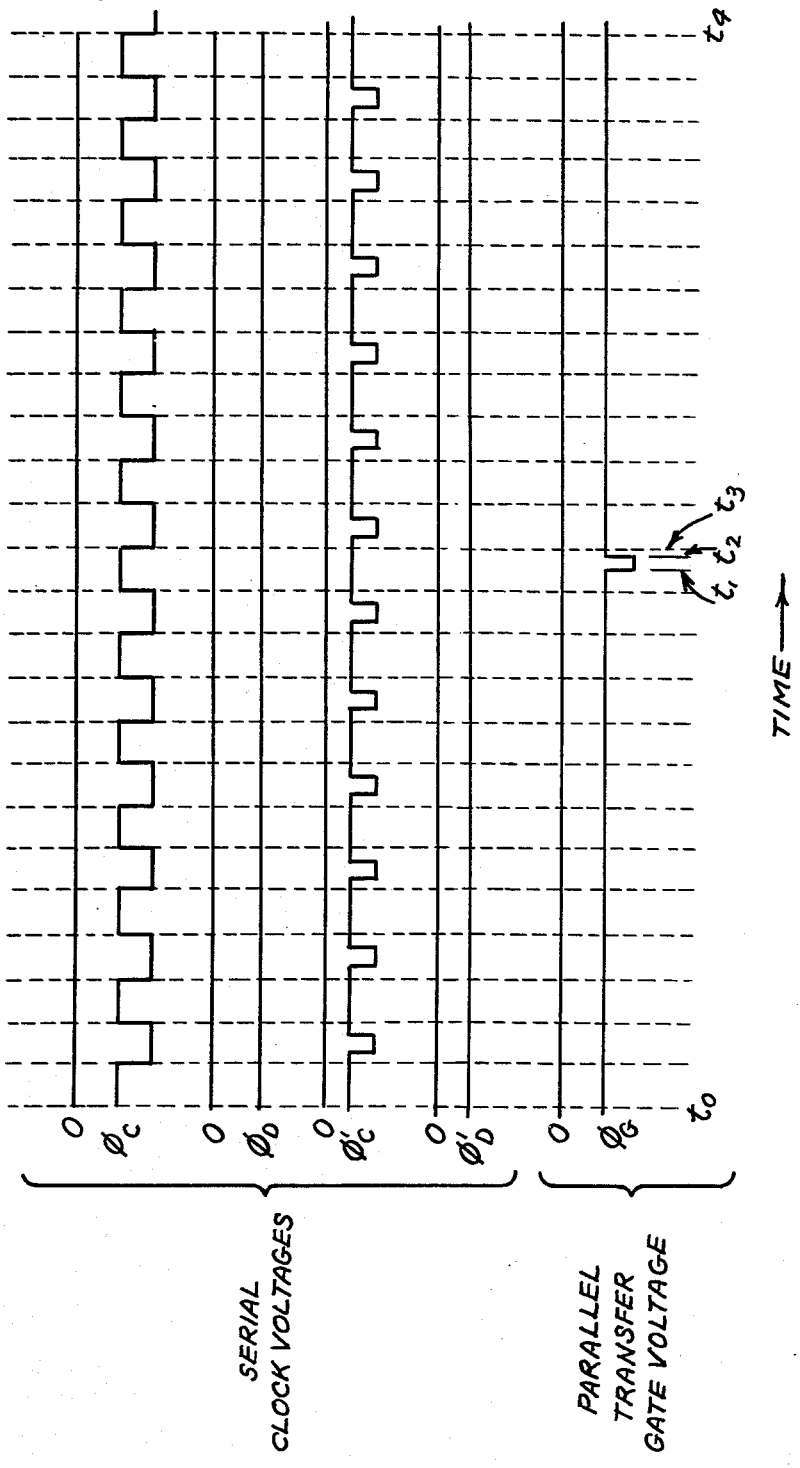

CHARGE TRANSFER FILTER

The present invention relates in general to charge transfer devices and more particularly to charge transfer structures for providing first order exponential smoothing of repetitive analog signals.

The present invention relates particularly to non-recursive accumulator-type filter structures of the type described in copending application Ser. No. 775,662 of William E. Engeler et al for Charge Transfer Filter, now U.S. Pat. No. 4,124,862, and copending patent application Ser. No. 618,747 of William E. Engeler et al for Charge Transfer Filter, now U.S. Pat. No. 4,124,861 both of which are of common assignee herewith and the contents of which are incorporated herein by reference thereto.

An object of the present invention is to provide improvements in the charge transfer filters of the aforementioned patent applications.

Another object of the present invention is to provide charge transfer filters capable of operation at higher speeds than heretofore possible.

Another object of the present invention is to provide charge transfer filter structures having long filter time constants.

A further object of the present invention is to provide a charge transfer filter structure which is relatively insensitive to processing and material dependent non-uniformities, such as thermally generated dark current.

In carrying out the invention in one illustrative embodiment thereof there is provided a substrate of semiconductor material of one conductivity type having a major surface. Means are provided for forming a charge storage region adjacent the major surface of the substrate including a first electrode and a second electrode, each of which insulatingly overlies the storage region. The first electrode and the major surface of the substrate form a first capacitor. The second electrode and the major surface of the substrate form a second capacitor. A third capacitor is provided including a third electrode and a fourth electrode. Means are provided for conductively connecting the third electrode to the surface adjacent region of the substrate underlying the first electrode and for connecting the fourth electrode in circuit with the substrate. A sampling means is provided for developing a sequence of first quantities of charge, each quantity corresponding to a respective value of a series of successive values of an analog signal. Introducing means including the second electrode are provided for introducing serially each of the quantities of charge of the sequence into the storage region. Removing means including the second electrode are provided for removing periodically a fixed fraction less than one of the total of the first quantities of charge contained in the storage region to provide a sequence of second quantities of charge. The fixed fraction of charge periodically removed from the storage region by the removing means is determined by the ratio of the capacitance of the second capacitor to the total capacitance of the first, second and third capacitors.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

FIG. 1 shows a plan view of one embodiment of the charge transfer filter structure in accordance with the present invention.

FIG. 2 shows a sectional view of the apparatus of FIG. 1 taken along section lines 2—2 of FIG. 1.

FIG. 3 shows a diagram of semiconductor surface potential versus distance along the semiconductor surface of the charge transfer filter structure of FIGS. 1 and 2 useful in explaining the operation of the present invention.

FIGS. 4A through 4E show diagrams of voltage waveforms useful in explaining the operation of the apparatus of the present invention.

Reference is now made to FIGS. 1 and 2 which show apparatus 10 in accordance with the present invention. The apparatus includes a charge transfer shift register 11 into which packets or quantities of charge corresponding to samples of a time varying analog signal are inserted and removed. The apparatus 10 also includes a plurality of accumulator stages 12, only two of which are shown completely. Each accumulator stage 12 is coupled to a respective stage of the shift register 11 through a respective gating stage 14. Each of the gating stages 14 are under the control of a parallel transfer gate 15. During a first period of time quantities of charge corresponding to samples of time varying analog signals are clocked into the shift register 11 and stored therein. During a second period of time the parallel transfer gate 15 is opened to allow the charge stored in the shift register in each of the stages thereof to equilibrate with charge in a respective storage region of the accumulators 12. During a third period of time the parallel transfer gate 15 is closed thereby containing in each of the stages of the shift register a fixed fraction of the charge equilibrated in a respective accumulator stage of the apparatus.

The shift register 11 and the accumulator stages 12 are formed on a semiconductor substrate 20 of N-type conductivity which has a channel portion 22. Typically, the substrate may be silicon semiconductor material of suitable resistivity, for example, 4 ohm centimeters. Overlying, a major surface 16 of the substrate 20 is a thick insulating member 25 of silicon dioxide having a thin portion 26 therein lying in registry with the channel portion 22. In FIG. 1 the thick portions of the insulator 25 are indicated by shading. A plurality of first electrodes 31 are provided on the insulating member 25 overlying the thin portion 26. Each of the first electrodes is of uniform length in the direction of the length dimension of the channel portion 22, i.e. in the direction of charge transfer. Each of the first electrodes extends across both the thin insulating portion 26 and the bordering thick insulating portions of the insulating member 25. A plurality of second electrodes 32 is provided on the insulating member 25 overlying the thin portion 26. Each of the electrodes 32 is of uniform length in the direction of the length dimension of the channel portion 22 and equal to the uniform length of the first electrodes 31. Each of the electrodes 32 extends across both the thin insulating portion 26 and the bordering thick insulating portions of insulating member 25. An insulating layer 29 is provided over the electrodes 31 and 32. A plurality of first transfer electrodes 33 are provided over the insulating layer 29. Each of the first transfer electrodes 33 is insulatingly spaced between a respective second electrode 32 and an adjacent succeeding first electrode 31 and overlying these electrodes. A plurality of second transfer electrodes 34 are provided over the insulating layer 29. Each of the second transfer electrodes 34 is insulatingly spaced between a respective first electrode 31 and an adjacent succeeding second electrode 32 and overlying these electrodes. Each of the transfer electrodes 33 and 34 is of substantially uniform extent in the direction of the length of the channel portion 22 and extends over the thin insulating portion of the insulating member 25 as well as the bordering thick insulating portions thereof.

All of the first electrodes 31 of the shift register 11 are connected to a line 36 to which a $\phi_D$ voltage is supplied from a fixed voltage source 41. All of the second electrodes 32 of the shift register 11 are connected to line 37 to which a $\phi_C$ voltage is supplied from a clocking waveform generator 42. The clocking waveform generator 42 is under the control of the timing generator 44. All of the first transfer electrodes 33 of the shift register 11 are connected to a $\phi_D'$ line 38 to which a $\phi_D'$ voltage is supplied from fixed voltage source 41. All of the second transfer electrodes 34 of the shift register 11 are connected to a $\phi_C'$ line 39 to which a $\phi_C'$ voltage is applied from a clocking waveform generator 42. The $\phi_C$, $\phi_D$, $\phi_C'$ and the $\phi_D'$ voltage waveforms are shown in FIGS. 4A through 4D, respectively.

The accumulator stages 12 are formed on the semiconductor substrate 20 and each includes a first surface adjacent portion 27 of generally rectangular outline and a third surface adjacent portion 28 of generally rectangular outline. A plurality of thin insulating portions 52 are provided in the insulating member 25, each thin insulating portion 52 being of generally rectangular outline and lying in registry with a respective one of the first surface adjacent portions 27. Also a plurality of thin insulating portions 54 are provided in the insulating member 25, each thin insulating portion 54 being of rectangular outline and lying in registry with the third surface adjacent portion 28 of the substrate. A plurality of first electrodes 56 is provided, each overlying a respective first surface adjacent portion 27 to form first capacitors therewith. A plurality of third electrodes 57 is provided, each overlying a respective third surface adjacent portion 28 of the substrate to form third capacitors therewith. A thin insulating layer 29 is provided over the first electrodes 56 and the third electrodes 57. A plurality of first regions 61 of opposite conductivity type indicated by stiple shading in FIG. 1 is provided in the substrate adjacent the major surface 16 thereof, each contiguous with a respective first surface adjacent portion 27. Each first region 61 of opposite conductivity type is connected to a respective third electrode 57 by a conductor 62. A second region 64 of opposite conductivity type also indicated by stiple shading in FIG. 1 is provided in the substrate adjacent a major surface thereof and contiguous to each of the surface adjacent portions 28 of the substrate underlying the third electrodes 57. A conductive connection 65 is made through an opening in a thin insulating portion of insulating member 25 to the substrate 20. A fifth electrode 67 is provided over the thin insulating layer 29 covering the third electrode 57 and conductively connected to the substrate 20 and the second region of opposite conductivity type 64. A conductive connection 68 is provided to all of the first electrodes 56 which is connected to the $\phi_D$ line 36 of the fixed voltage source 41. Thus, with the application of the indicated potential to a first electrode 56 a first capacitance is provided between the first electrode and the substrate. The region 61 senses the surface potential appearing at the surface underlying the first electrode and applies the surface potential to the third electrode which, in turn, causes an inversion layer to be formed in the substrate underlying the third electrodes. Thus, a third capacitor is provided in which the third electrode is one terminal of the capacitor and the inversion layer is the other terminal. The fifth electrode 67 is insulatingly overlying the third electrode forms with the third electrode 57 a fourth capacitor connected in parallel with the third capacitor, which in turn is connected in parallel with the first capacitor. The $\phi_D$ electrodes of the shift register 11 form with the surface adjacent regions of the substrate lying thereunder second capacitors.

A plurality of thin recesses 71 are provided in the thick insulating member 25 underlying which are thin insulating portions 71a, each connecting a respective part of the thin insulating portion 26 with a respective part of the thin insulation portion 52. The first or $\phi_D$ electrodes 31 of the shift register 11 extend into the recesses 71 and each overlie a first part of a respective thin insulating portion 71a. A parallel transfer gate or line 15 is provided on the insulating portion 25 between the thin insulating portions 26 and 52 overlying the recesses 71 between the $\phi_D$ electrodes 31 and the first electrodes 56. The parallel transfer gate 15 is connected to a parallel transfer gate control 74 which provides a parallel transfer gate voltage $\phi_G$, as shown in FIG. 4E. The parallel transfer gate control 74 is synchronized with the timing generator 44. When a suitable gate potential is applied to the gate electrode 15 a conductive channel is formed in the underlying surface adjacent region of the substrate 20 which enables transfer of charge from the storage regions 22 underlying the $\phi_D$ electrodes of the shift register 11 to the first storage regions 27 underlying the first electrodes 56 of the accumulator stages. The parallel transfer gate voltage is shown in FIG. 4E.

Each stage of the shift register 11 includes a $\phi_D$ storage region underlying a $\phi_D$ electrode 31 and a $\phi_C$ storage region underlying a $\phi_C$ electrode 32. The $\phi_D$ voltage applied to the $\phi_D$ electrode is fixed. The $\phi_C$ voltage applied to the $\phi_C$ electrode cycles between a high level and a low level above and below the $\phi_D$ voltage. When the $\phi_C$ voltage is at its high level, charge transfer is enabled from the $\phi_C$ storage region to the $\phi_D$ storage region and conversely when the $\phi_C$ voltage is at its low level, charge transferred from the $\phi_D$ storage region to the $\phi_C$ storage region is enabled. Each stage also includes a $\phi_D'$ electrode 33 to which is applied a $\phi_D'$ voltage of fixed value which produces a surface potential in the substrate underlying the electrode which is smaller in absolute magnitude than the surface potential underlying a $\phi_D$ electrode. Each stage also includes a $\phi_C'$ electrode 34 to which is applied a $\phi_C'$ voltage having two levels. At the upper level a surface potential is produced in the substrate underlying the electrode which inhibits the transfer of charge from a $\phi_D$ storage region to a $\phi_C$ storage region. At the lower level a surface potential is produced enabling the transfer charge from a $\phi_D$ storage region to a $\phi_C$ storage region.

Packets of charge for insertion into the shift register 11 are generated by an input circuit 77 under the control of the clocking waveform generator 42 and in response to an analog input signal. One input circuit for providing a sequence of packets of charge in response to an analog input circuit and for inserting the packets into a charge transfer shift register is described in connection with FIGS. 2 and 3 of patent application Ser. No. 787,915, filed Apr. 15, 1977, now U.S. Pat. No. 4,126,852, and assigned to the assignee of the present invention.

After charge packets have been clocked into the shift register 11 and have been equilibrated and divided in the various accumulator stages 12 of the apparatus in a manner to be explained below, the resultant packets of charge are contained in the storage regions underlying the $\phi_D$ electrodes 31. The resultant packets of charge are then clocked out of the shift register and sensed in an output circuit 78 from which an output signal is obtained. One output circuit suitable for providing an output in accordance with the sequence of packets of charge clocked thereinto is described in connection with FIG. 1 of patent application Ser. No. 825,924, filed Aug. 19, 1977, now U.S. Pat. No. 4,125,786 and assigned to the assignee of the present invention.

The operation of the apparatus of FIGS. 1 and 2 will now be explained in connection with the waveform diagrams of FIGS. 4A through 4E. during a first period of time, $t_0$–$t_1$, a first sequence of charge samples or packets are generated and clocked into the shift register 11. Each packet may represent a sample of a respective one of a plurality of analog signals. During a second period of time, $t_1$–$t_2$, after charge has been transferred into the $\phi_D$ storage regions, a gating pulse 75 (FIG. 4E) is provided to the parallel transfer gate 15 enabling the charge underlying each of the $\phi_D$ electrodes to flow into surface adjacent portions of the substrate underlying the first electrodes 56 and equilibrate therewith as well as with the potential on the third electrode 57 of the third capacitor. Upon termination of the pulse 75 at time $t_2$ packets of charge are divided out of the accumulator and are contained in the storage regions underlying the $\phi_D$ electrodes of the shift register 11. The portion of the charge separated or divided out of the parallel capacitors comprising the first, second, third and fourth capacitors of an accumulator stage is determined by the ratio of the capacitance of the $\phi_D$ electrode with respect to the surface adjacent region of the substrate lying thereunder, referred to as the second capacitor, in relation to the aforementioned total capacitance of the first, second, third and fourth capacitors. During a third period of time, $t_3$–$t_4$, subsequent to time $t_2$, the packets of charge stored in the storage regions underlying the $\phi_D$ electrodes are clocked out into the output circuit 78 where they are sensed and an output signal is developed therefrom. During the third period of time while packets of charge are being clocked out of the shift register a second sequence of packets representing second samples of the analog signals are clocked into the shift register for processing in the same manner as the first sequence of packets. Thus, successive sequences of packets representing samples of analog signals are processed and read out. Corresponding output samples of sucessive sequences may be demultiplexed to provide a plurality of sequences of output samples, each corresponding to a respective one of the analog signals from which the input sequences of samples were derived. The time period, $t_1$–$t_2$, occurs during the portion of the $\phi_C$ clock cycle when $\phi_C$ voltage is high without any interruption in the clocking of charge in the shift register 11. As the equilibration time is independent of the total capacitance, the apparatus is capable of handling high data rates concurrently with long accumulator smoothing time constants.

Reference is now made to FIG. 3 which shows a diagram of surface potential $\phi_S$ in the substrate as a function of distance along the substrate. The particular condition shown is for the condition in which the transfer gate 15 is in its high or OFF position after a sequence of charges have been clocked into the shift register 11 and equilibrated with the charge in the accumulator stages 12 and thereafter divided out in preparation for reading out of the output packets of charge. The level 81 represents the potential at the surface of the substrate underlying the $\phi_D$ or second electrode 31 in response to $\phi_D$ voltage applied thereto. The level 82 represents the surface potential when a packet of charge is present at major surface of the substrate underlying the $\phi_D$ electrode. The level 83 underlying the parallel transfer gate 15 represents the surface potential due to the application of a gating potential to the parallel transfer gate 15 inhibiting the transfer of charge. The dotted level 84 represents the approximate surface potential which would appear underlying the parallel transfer gate 15 when a gating potential permitting the transfer of charge is applied thereto. The level 85 represents the surface potential underlying the first electrode 56 of the accumulator in the absence of charge stored in the surface adjacent region lying thereunder. The level 86 represents the surface potential of surface adjacent region 27 underlying the first electrode 56 when charge is present. The first region 61 of opposite conductivity type is contiguous to the surface adjacent region 27. Consequently, the potential which the first region 61 attains is the same as the potential of the surface adjacent region 27 underlying the first electrode 56. As the potential sensing region 61 of opposite conductivity type is connected to the third electrode 57, a depletion region is produced in the substrate and the surface potential underlying the third electrode in the absence of charge is represented by the level 87. Level 87 is slightly higher than level 86 by an amount equal to the threshold voltage of the third electrode 57 with respect to the substrate. As region 64 is contiguous with the surface adjacent region underlying the third electrode 57, upon application of the potential of level 86 to the third electrode, an inversion layer is established having a potential at the surface of the substrate equal to the potential of the region 64 which is connected to substrate.

While in the embodiment of FIGS. 1 and 2, a third capacitor constituted of the third electrode 57 and the inversion layer in the substrate underlying the third electrode 57, and a fourth capacitor constituted of the third electrode 57 and the fifth electrode 67, were provided, either one of these capacitors could be eliminated, if desired. For example, to provide a structure including just the fourth capacitor, the third electrode 57 would be situated on a thick portion of the oxide layer 25 and the fifth electrode 67 would be spaced in insulating relationship thereto. The fifth electrode 67 could be connected to substrate or any positive or negative bias potential with respect thereto. Of course, if it is desired to eliminate the fourth capacitor constituted of electrodes 57 and 67, the overlying electrode 67 would be eliminated.

The area of electrodes 57 can be made very large in relation to the area of electrodes 56 thereby providing a third capacitor which is large in relation to the first capacitor, and also a fourth capacitor which is large in relation to the first capacitor. Each of the third and fourth capacitors may be further increased by reducing the thickness of the oxide or insulation lying between the electrodes thereof. The size of the third and fourth capacitors in relation to the first capacitor has no effect on the equilibration time necessary for equilibration of charge in the storage region underlying the second electrode 31 with the charge in the storage region 27 underlying the first electrode 56. The area of the first electrode 56 and the area of the second electrode 31 may be made small and comparable to one another, and also the charge transfer distance under gate 15 may be made small. Thus, equilibration times can be made small. As the equilibration surface potential in the storage region 27 underlying the first electrode is the potential appearing on the third electrode 57, potential equilibration takes place using not only the charge in the first and second storage regions underlying electrodes 56 and 31 but also the charge in the third and fourth capacitors. Thus, the effective equilibration area of each of the accumulator stages can be made much larger than the actual equilibration area. Also, as equilibration time is independent of area of the third and fourth capacitors, the latter capacitors can be made large. Thus, smoothing time constants which are long in relation to the rate at which charge samples are equilibrated in the accumulator stages may be utilized. Expressed in other words, as equilibration occurs at a high speed, high data rates may be utilized, and concurrently as the smoothing time constant is independent of equilibration time, very long time constants may be used in connection with each of the stages. In addition, as the area of electrode 56 is made small in relation to the area of electrode 57, the dark current component of charge introduced into the accumulator due to thermal generation of charge in the substrate can be kept to a relatively small value.

While the invention has been described in connection with apparatus constituted of N-type conductivity substrates, P-type conductivity substrates could as well be used. Of course, in such case the applied potentials would be reversed in polarity.

While the invention has been described in a specific embodiment, it will be understood that modifications, such as those described above, may be made by those skilled in the art, and it is intended by the appended claims to cover all such modifications and changes as fall within the true spirit and scope of the invention.

What I claim as new and desire to secure by Letters Patent of the United States is:

1. In combination,
   a substrate of semiconductor material of one conductivity type having a major surface,
   means forming a charge storage region adjacent said major surface of said substrate including a first electrode and a second electrode each insulatingly overlying said storage region, said first electrode and the major surface of said substrate forming a first capacitor, said second electrode and the major surface of said substrate forming a second capacitor,
   a third capacitor including a third electrode insulatingly overlying a surface adjacent region in said substrate and a fourth electrode, means for conductively connecting said third electrode to the surface adjacent region of said substrate underlying said first electrode and for connecting said fourth electrode to said substrate,
   a sampling means for developing a sequence of first quantities of charge, each quantity corresponding to a respective value of a series of successive values of an analog signal,
   introducing means including said second electrode for introducing serially each of said quantities of charge of said sequence into said storage region,
   removing means including said second electrode for removing periodically a fixed fraction less than one of the total of said first quantities of charge contained in said storage region to provide a sequence of second quantities of charge, said fixed fraction of charge periodically removed from said storage region by said removal means being determined by the ratio of the capacitance of said second capacitor to the total capacitance of said first, second and third capacitors.

2. The combination of claim 1 in which said fourth electrode is conductively connected to said substrate.

3. The combination of claim 1 in which said means for conductively connecting said third electrode to the surface adjacent region of said substrate underlying said first electrode includes a region of opposite conductivity type in said substrate adjacent the surface adjacent region of said substrate underlying said first electrode and a conductive connection between said region of opposite conductivity type and said third electrode.

4. The combination of claim 3 including means for biasing said third electrode with respect to said substrate to establish an inversion layer in the surface adjacent region of said substrate underlying said third electrode, said inversion layer constituting said fourth electrode.

5. The combination of claim 4 in which said fourth electrode also includes a conductive member insulatingly overlying said third electrode, in which a second region of opposite conductivity type is provided in said substrate contiguous to said inversion layer, said conductive member conductively connected to said second region of opposite conductivity type.

6. The combination of claim 3 in which said fourth electrode is a conductive member insulatingly overlying said third electrode and connected to said substrate.

7. The combination of claim 1 in which said removal means includes a gating electrode insulatingly overlying adjacent edges of said first and second electrodes and said substrate.

8. In combination,
   a substrate of semiconductor material of one conductivity type having a major surface,
   means forming a plurality of n charge storage regions adjacent said major surface of said substrate, each storage region including a first electrode and a second electrode, said first and second electrodes insulatingly overlying said storage region, said first electrode and the major surface of said substrate forming a first capacitor, said second electrode and the major surface of said substrate forming a second capacitor, a third capacitor including a third electrode and a fourth electrode, means for conductively connecting said third electrode to the surface adjacent region of said substrate underlying said first electrode and for connecting said fourth electrode to said substrate,
   means for developing in succession sequences of first quantities of charge, each sequence having the same number n of first quantities of charge, each first quantity of a sequence corresponding to a sample of a respective one of a plurality of analog signals, corresponding first quantities of charge in a pair of successive sequences representing corresponding values of an analog signal separated by a fixed period of time, a shift register having n stages, each stage including a respective one of said second electrodes, means for serially transferring the quantities of charge in each sequence in succession into the n stages of said shift register, means for transferring the quantities of charge in a sequence from each stage of said shift register into a respective one of said storage regions, means for periodically dividing the total charge in each of said storage regions into a first part in a first portion and a second part in a second portion after each transfer of a first quantity of charge into a respective storage region and the equilibration of the resultant charge in the respective storage region to provide a sequence of second quantities of charge, the ratio of each second part to a respective first part of the total charge being a fixed fraction less than 1, said fixed fraction being determined by the ratio of the capacitance of said second capacitor to the total capacitance of said first, second and third capacitors, a second electrode insulatingly overlying a second portion, means for serially transferring said sequence of second quantities of charge out of said shift register, means for sensing each of said second quantities of charge from said shift register to obtain an output signal.

* * * * *